United States Patent [19]
O'Mara

[11] Patent Number: 4,459,159
[45] Date of Patent: Jul. 10, 1984

[54] METHOD FOR MAKING SEMI-INSULATING SUBSTRATE BY POST-PROCESS HEATING OF OXYGENATED AND DOPED SILICON

[76] Inventor: William C. O'Mara, 111 Main St., Los Altos, Calif. 94022

[21] Appl. No.: 426,867

[22] Filed: Sep. 29, 1982

[51] Int. Cl.$^3$ ................. H01L 21/225; H01L 7/54
[52] U.S. Cl. ................... 148/1.5; 29/576 B; 148/187; 357/58; 357/91
[58] Field of Search ............ 148/1.5, 187; 29/576 B; 357/58, 91

[56] References Cited

U.S. PATENT DOCUMENTS

| | | | |
|---|---|---|---|
| 3,909,307 | 8/1975 | Stein | 148/1.5 |
| 4,116,719 | 9/1978 | Shimizu et al. | 148/1.5 |
| 4,220,483 | 9/1980 | Cazcarra | 148/1.5 |
| 4,344,815 | 8/1982 | Cazarra et al. | 156/601 |
| 4,393,578 | 7/1983 | Cady et al. | 29/576 B |
| 4,420,870 | 12/1983 | Kimura | 29/571 |

FOREIGN PATENT DOCUMENTS 2080780 2/1982 United Kingdom .

OTHER PUBLICATIONS

Antoniadis et al., J. Electrochem. Soc. 125 (1978) 813.
Wruck et al., Phys. Stat. Solid 56a (1979) 557.
Glowinski et al., J. Phys. Chem. Solids, 38 (1977) 963.
Murgai, et al., "Microdistribution of Oxygen in Silicon," J. Electrochemical Society, Solid–State Science and Technology, vol. 127, No. 5, May 1980-pp. 1182–1186.
Fuller and Logan, "Effect of Heat Treatment Upon the Electrical Properties of Silicon Crystals"; Journal of Applied Physics, vol. 28, No. 12, p. 1427, Dec., 1957.

Primary Examiner—Roy Upendra
Attorney, Agent, or Firm—Thomas Schneck

[57] ABSTRACT

A method for making semiconductor integrated circuits which improves and decreases fringing capacitance in semiconductor integrated circuits. An oxygenated, single-crystal silicon lamella is lightly doped, producing an excess of holes, thereby forming a semiconductor substrate. The substrate is used to fabricate semiconductor devices in the usual way, except that density may be slightly increased. After fabrication, the substrate is heated, preferably at 450° C., until resistivity of the substrate has increased so that non-diffused regions of the substrate are substantially non-conductive.

12 Claims, 4 Drawing Figures

METHOD FOR MAKING SEMI-INSULATING SUBSTRATE BY POST-PROCESS HEATING OF OXYGENATED AND DOPED SILICON

DESCRIPTION

1. Technical Field

The invention relates to a thermal method of making improved high density integrated circuits and in particular to a method of increasing the density of p-n junctions within integrated circuit substrates by postfabrication annealing.

2. Background Art

It is known that in manufacturing semiconductor integrated circuits a semi-insulating or very high resistivity substrate may be used to minimize fringing capacitance and improve the speed-power product. In the past, substrates of gallium arsenide have been made semi-insulating by doping with chromium or by growing such substrates under very high purity conditions. These devices have been made either directly by ion implantation or by growing an epitaxial layer of the desired resistivity, then diffusing active areas.

Another technique for producing high resistivity substrates, known in the prior art, is the growth of an epitaxial silicon layer on a sapphire substrate. The layer is used for construction of p-channel and n-channel devices. The thickness of the epitaxial layer is on the order of 1 micrometer.

An object of the invention is to devise an improved integrated circuit construction featuring a high resistivity substrate.

DISCLOSURE OF INVENTION

High resistivity substrates for integrated circuit fabrication have been achieved by using an oxygenated, lightly doped lamella of single crystal silicon as a substrate for integrated circuit manufacture and heating the substrate, preferably at 450° C. at the end of device manufacture. This has been found to render the substrate semi-insulating by producing donors from interstitial oxygen within the wafer. The oxygen is originally incorporated into the silicon lattice during Czochralski crystal growth by the partial dissolving of the quartz crucible used to contain the melt into the melt itself. Oxygen donors form at 450° C. at the rate of $10^{13}/cm^3$/second where the number of oxygen atoms is about $2 \times 10^{18}$ atoms per cc. These atoms contribute about $10^{16}$ donor electrons per cc to neutralize the dopant. Normally a p-type substrate is used with doping levels in the range of $10^{14}$–$10^{15}$ atoms per cc, within an order of magnitude, so that the oxygen donors can compensate the p-type dopant, usually boron, rendering the substrate high in resistivity or semi-insulating.

The high resistivity substrate minimizes fringing capacitance and improves the speed-power product of p-n junctions built on the substrate. This allows closer spacing of p-n junctions, with an increased density of the number of active circuit devices which may be built on a substrate.

BEST MODE FOR CARRYING OUT THE INVENTION

Figure 1:
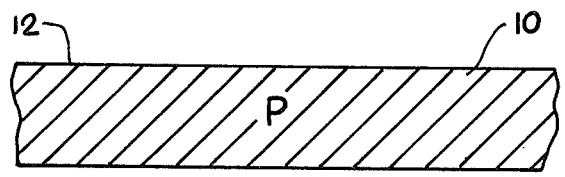
FIGS. 1–4 are schematic representations of the sequential process steps for making a semi-insulating silicon substrate in accordance with the present invention.
Figure 2:
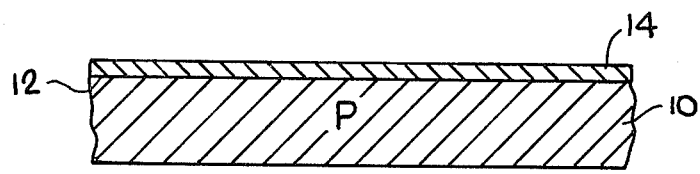

In carrying out the present invention, it is important that the substrate be maintained at the desired doping level. A silicon wafer FIG. 1 shows doped in the usual way with an impurity such as a boron at doping levels in the range of $10^{14}$–$10^{15}$ atoms per cc, within an order of magnitude, so that a p-type substrate 10 is obtained. The silicon wafer itself is made by the Czochralski process in which oxygen is partially dissolved from a quartz crucible used to contain the silicon melt. The preferred oxygen concentration is $10^{18}$ oxygen atoms per cc, plus or minus an order of magnitude. The surface where devices are to be built by diffusion or implantation should be depleted of oxygen by oxidizing in a chlorine atmosphere or similar oxidizing atmosphere. FIG. 2 shows the method of providing an oxygen-free surface involving deposition of an epitaxial silicon layer 14 on the surface 12 of the substrate. The typical thickness of the substrate is 200 to 400 micrometers.

Figure 3:
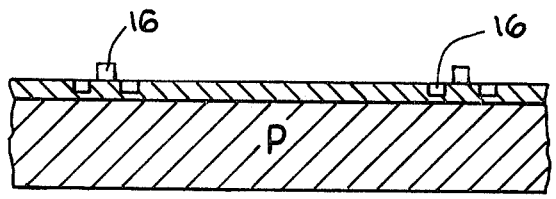

After the epitaxial layer is complete, integrated circuit devices 16 as shows in FIG. 3 are built into the epi-covered substrate in the usual way. For example, MOS or bi-polar transistors, diodes and the like may be fabricated in accord with well-known semiconductor manufacturing processes. The only difference in construction between prior art devices and the present invention is that the devices in the present invention may be more closely spaced, by as much as 10%, depending on the particular manufacturing process being used.

Figure 4:
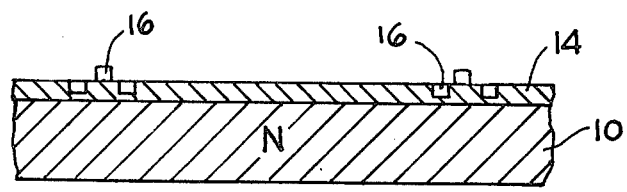

After device fabrication, a heating step is performed, preferably at 450° C. which transforms the oxygen from a generally electrically inert species to an electrically active species which neutralizes the electrical activity of the dopant in the substrate, 10 as shown in FIG. 4 without affecting p-n junction action. Highly doped p- or n-regions 16 diffused or implanted into the substrate are not measurably affected by this heating step. Only lightly doped regions are affected. While heating at 450° C. is preferred, there may be some variance from this preferred temperature within approximately plus or minus 100° C. If lower temperatures are used, formation of electrically active oxygen atoms will take longer, while higher temperatures will produce them faster. Plots of concentration versus annealing time for three different temperatures are found in an article entitled "Mechanism of the Formation of Donor States in Heat-Treated Silicon" by W. Kaiser et al. in Physical Review, 112, 5 p. 1546-1554.

EXAMPLE

Table 1 shows a series of infrared measurements made in accord with the method of D. Wruck et al. in Phys. Stat. Sol. (a) 56, 557 (1979), pp. 557 ff. and ASTM procedure F121. The table shows three samples, labeled (1) seed, (2) tail and (3) thick. The terms refer to samples taken from (1) initial and (2) final portions of one crystal drawn from a melt and (3) a sample from another crystal, respectively. The measurements made in the table indicate carbon and oxygen content before heating and at various times as heating progresses. Times are cumulative starting prior to heating and ending 86.25 hours later. The table indicates that the oxygen level declines from 4 to 7% over the total heating period. The table indicates that the number of donors which can be created depends upon the starting oxygen level. By measuring the oxygen content before heating and at various times later, resistivity can be determined by prior calibration measurements.

TABLE 1

| Infrared | Carbon | Oxygen |
|---|---|---|
| | (parts per million) | |
| | T = 0 | |
| SEED | .32 | 29.83 |
| TAIL | 2.41 | 26.97 |
| THICK | .28 | 35.80 |
| | T = 30 min. at 450° C. | |
| SEED | .20 | 29.46 |
| TAIL | 2.44 | 27.10 |
| THICK | .38 | 35.48 |
| | T = 1.5 hr. at 450° C. | |
| SEED | 0.29 | 29.62 |
| TAIL | 2.56 | 27.02 |
| THICK | 0.85 | 37.05 |
| | T = 5.75 hr. at 450° C. | |
| SEED | 0.37 | 29.51 |
| TAIL | 2.62 | 26.98 |
| THICK | 0.27 | 35.64 |
| | T = 13.75 hr. at 450° C. | |
| SEED | 0.32 | 29.12 |
| TAIL | 2.34 | 26.75 |
| THICK | 0.90 | 35.88 |
| | T = 37.75 hr. at 450° C. | |
| SEED | 0.30 | 28.86 |
| TAIL | 2.37 | 26.63 |
| THICK | N.D. | 34.64 |
| | T = 86.25 hr. at 450° C. | |
| SEED | 0.34 | 28.25 |
| TAIL | 2.43 | 25.90 |
| THICK | 0.72 | 33.12 |

Donor formation is shown in Table 2. All samples were borondoped. The table indicates that for heating up to between 5.75 hours and 13.75 hours, nearly all of the measurements indicate the silicon is p-type material. After 13.75 hours all of the material has been converted to n-type material. This indicates that enough donors have been created to compensate or neutralize the acceptors. Note that the tail sample at 37.75 hours shows approximately 2,000 ohm-cm resistivity, which is difficult to achieve by other means. Significant resistivity effects begin to occur after 1.5 hours heating at 450° C., with the effectiveness of heating being mainly between 1.5 and 85 hours at 450° C. Other temperatures can be used, but 450° C. is the reference or effective temperature. Heating should be uniform across the wafer to within 5° C.

The measurements indicate that donors are created in the temperature range of between 300° to 500° C. Donors are annihilated or destroyed at temperatures above 500° C. Resistivity is measured by a four-point probe in accord with ASTM procedure F-43. Conductivity type (n- or p-type) is measured with a hot probe, ASTM procedure F-43.

Recently, a new donor species, also due to oxygen, has been discovered by others. This species is formed at 650° C. and is enhanced by first annealing at 470° C. This donor is formed at a much slower rate than the species previously described with reference to heating at 450° C. The new spcies may need 100 hours or more to yield a concentration of $10^{15}/cm^3$ concentration of electrons. See Journal of Applied Physics, 50, 8095 (1979) by A. Kanamori et al. Heating should take place until resistivity is increased by three orders of magnitude or better, or until the conductivity type changes.

TABLE 2

| Resistivity | T = 0 ohm-cm | T = 0.5 hr. at 450° C. | T = 1.5 hr. at 450° C. | T = 5.75 hr. at 450° C. | T = 13.75 hr. at 450° C. | T = 34.75 hr. at 450° C. | T = 86.25 hr. at 450° C. |
|---|---|---|---|---|---|---|---|
| | | | p-type | | | n-type | |
| SEED | 13.8 | 14.0 | 16.7 | 285 | OUT OF RANGE | 2.1 | 0.95 |
| | 13.7 | 13.8 | 16.2 | 180 | | 2.2 | 0.94 |
| | 13.8 | 14.5 | 16.5 | 315 | | 2.1 | 0.94 |
| | | | | 280 | | | |
| TAIL | 10.2 | 10.1 | 10.6 | 11.0 | 14 | 1530 | 2.90 |
| | 10.4 | 10.9 | 10.6 | 11.2 | 15 | 1520 | 3.01 |
| | 10.6 | 11.5 | 10.4 | 11.3 | 14 | 2000 | 2.98 |
| | | 10.4 | | | | | |
| THICK | 9.7 | 9.9 | 9.6 | 11.7 | 33 | 2.2 | 0.61 |
| | 9.8 | 9.5 | 9.7 | 11.6 | 31 | 2.2 | 0.61 |
| | 9.7 | 9.3 | 9.8 | 11.7 | 30 | 2.2 | 0.62 |

I claim:

1. A method of making a semi-insulating silicon substrate for semiconductor elements comprising,
    (a) forming an oxygenated, doped single crystal silicon wafer substrate having opposite major surfaces and having semiconductor electrical conductivity,
    (b) fabricating a semiconductor device on a surface of the substrate by creating a plurality of localized regions in said surface opposite in polarity to adjacent surface regions, thereby forming p-n junctions, the p-n junctions being separated from each other for electrical isolation, said device having high conductivity regions,
    (c) heating the fabricated semiconductor device and substrate to a temperature of between 300° C. and 500° C. until the substrate under the device is substantially electrically non-conductive.
2. The method of claim 1 further defined by:
    measuring the oxygen concentration in the substrate prior to device fabrication, and
    heating the device and substrate based upon said oxygen concentration until a desired resistivity is attained.
3. The method of claim 1 wherein said heating is for a duration of between 1.5 and 85 hours at an effective temperature of 450° C.
4. The method of claim 1 wherein said heating is for a duration wherein the p- or n-conductivity type of the substrate under the device changes from one conductivity type to the other.
5. The method of claim 1 further defined by depleting the surface of said substrate of oxygen prior to fabricating the semiconductor device on the surface of the substrate.
6. The method of claim 1 further defined by said device fabrication including the step of depositing an epitaxial silicon layer on said substrate surface for the formation of said p-n junctions.
7. A method of making a semi-insulating silicon substrate for semiconductor elements comprising, (a) forming an oxygenated, doped single crystal silicon wafer substrate having opposite major surfaces and having semiconductor electrical conductivity, (b) fabricating a semiconductor device on a surface of the substrate by creating a plurality of localized regions in said surface opposite in polarity to adjacent surface regions, thereby forming p-n junctions, the p-n junctions being separated from each other for electrical isolation, said device having high conductivity regions, (c) heating the fabricated device and substrate at least until the p- or n-conductivity type of the substrate under the device changes from one conductivity type to the other.

8. The method of claim 7 further defined by:
depleting the surface of said substrate of oxygen prior to fabricating the semiconductor device on the surface of the substrate.

9. The method of claim 7 further defined by:
said device fabrication including the step of depositing an epitaxial silicon layer on said substrate surface for the formation of said p-n junctions.

10. A method of making a semi-insulating silicon substrate for semiconductor elements comprising:
(a) forming an oxygenated single crystal silicon wafer substrate having opposite major surfaces,
(b) lightly doping the substrate with a dopant producing an excess of holes of generally uniform, known concentration of between $10^{13}$ to $10^{16}$ per cubic centimeter, at 27° C., thereby forming a semiconductor substrate,
(c) fabricating a semiconductor device on the surface of the substrate by creating a plurality of localized regions in said surface opposite in polarity to adjacent surface regions, thereby forming p-n junctions, the p-n junctions being separated from each other for electrical isolation, said device having heavily doped conductive regions, at least some of which are proximate to the substrate,
(d) heating the fabricated semiconductor device and substrate to a temperature of between 300° C. and 500° C. until said excess of holes in the substrate is neutralized by oxygen ions to the extent that resistivity of the substrate, under the device has been increased by at least three orders of magnitude, said device having said electrically conductive regions in the substrate surrounded by substantially non-conductive regions.

11. The method of claim 10 further defined by:
depleting the surface of said substrate of oxygen prior to fabricating the semiconductor device on the surface of the substrate.

12. The method of claim 10 further defined by:
said device fabrication including the step of depositing an epitaxial silicon layer on said substrate surface for the formation of said p-n junctions.

* * * * *